(12) United States Patent
Saunders

(10) Patent No.: US 7,804,369 B2
(45) Date of Patent: Sep. 28, 2010

(54) INTEGRATED FREQUENCY CALIBRATION ARCHITECTURE

(75) Inventor: David R Saunders, Scottsdale, AZ (US)

(73) Assignee: Viasat, Inc., Carlsbad, CA (US)

( * ) Notice: Subject to any disclaimer, the term of this patent is extended or adjusted under 35 U.S.C. 154(b) by 0 days.

(21) Appl. No.: 12/363,436

(22) Filed: Jan. 30, 2009

(65) Prior Publication Data
US 2009/0195321 A1    Aug. 6, 2009

Related U.S. Application Data

(60) Provisional application No. 61/025,559, filed on Feb. 1, 2008.

(51) Int. Cl.
  *G01R 23/00*  (2006.01)
  *G01S 13/00*  (2006.01)
  *H03L 7/00*   (2006.01)
(52) U.S. Cl. .............................. 331/25; 331/44; 324/199
(58) Field of Classification Search ................ 331/1 A, 331/8, 16–19, 25, 44; 342/175, 199; 375/376; 455/260
See application file for complete search history.

(56) References Cited

U.S. PATENT DOCUMENTS

| 4,677,394 A  | * | 6/1987  | Vollmer ...................... 331/1 A |
| 5,262,957 A  |   | 11/1993 | Hearn |
| 6,549,078 B1 |   | 4/2003  | Sridharan |
| 7,573,420 B2 | * | 8/2009  | Forstner et al. ............. 342/175 |

* cited by examiner

*Primary Examiner*—David Mis
(74) *Attorney, Agent, or Firm*—Snell & Wilmer L.L.P.

(57) ABSTRACT

In an exemplary embodiment, a free running VCO has two modes: a normal operating mode and a calibration mode. In the calibration mode, the free running VCO is phase lock looped with itself instead of a calibration VCO. Furthermore, in an exemplary embodiment, a tuning voltage for the free running VCO is adjusted to offset any tuning error. In addition, in various embodiments a reference crystal oscillator used in the phase lock loop is located on a DSP module instead of on the RF module. In yet another exemplary embodiment, the free running VCO is the only high frequency VCO on a radio frequency module.

20 Claims, 4 Drawing Sheets

INTEGRATED FREQUENCY CALIBRATION ARCHITECTURE

CROSS REFERENCE TO RELATED APPLICATION

This application claims priority to U.S. Provisional Application 61/025,559, entitled "Highly Integrated Circuit Architecture", which was filed on Feb. 1, 2008 and is hereby incorporated by reference.

BACKGROUND OF THE INVENTION

Automotive radar products are typically made by assembling a number of discrete components on one or more printed circuit boards. This results in automotive radar products that are typically undesirably bulky. Additionally, current narrowband frequency modulated continuous wave (FMCW) automotive radar products transmit a signal with a frequency ramp in discrete frequency steps. The discrete frequency steps are created using a digital-to-analog converter (DAC) integrated circuit to tune a free-running voltage controlled oscillator (VCO). The DAC is generally located on a Digital Signal Processor (DSP) module and the tuning voltage is communicated from the DSP module to a separate printed circuit board containing the VCO. Unfortunately, traversing a board-to-board connection makes the tuning voltage more susceptible to noise.

The VCO typically requires frequency calibration over a range of temperatures because the oscillator frequency varies with the temperature. Generally, a free running VCO is calibrated by comparing its frequency to the frequency of a second VCO, which is referred to herein as a calibration VCO. The calibration VCO, in turn, is phase locked to a crystal oscillator to generate a reference frequency. When the free-running oscillator is swept over a frequency range which encompasses the reference frequency, a mixer translates the reference frequency to direct current (DC), causing an impulse in the baseband filter. The impulse can be observed using an analog-to-digital converter to determine the free-running oscillator's tuning voltage that corresponds to the reference frequency.

With reference to FIG. 1, a prior art FMCW radar system 100 comprises a transmit portion 110 and a receive portion(s) 120 of a radio frequency (RF) module 199. Furthermore, transmit portion 110 and receive portion(s) 120 are in communication with a digital signal processor (DSP) module 130. The transmit and receive portions typically comprise discrete components. However, assembling the discrete components of RF module 199 results in an overall size increase in comparison to highly integrated circuit architecture.

Furthermore, the typical design of radar system 100 includes a free running VCO 101 and a phase locked loop (PLL) architecture 150. A typical PLL architecture 150 comprises a calibrating VCO 152, a reference crystal oscillator (XSTL) 151, a PLL 153, and a loop filter 154. Calibrating VCO 152 operates at a known frequency due to being in a phase lock loop with XSTL 151.

In addition, PLL architecture 150 is generally isolated from free running VCO 101 on RF module 199 because the output of calibrating VCO 152 is multiplied and operates at the same, or approximately the same, frequency as free running VCO 101. As is well known, having signals with similar frequencies in close proximity may result in signal interference and noise.

With continued reference to prior art FIG. 1, one manner of tuning free running VCO 101 involves VCO tuning circuit on DSP module 130 comprising a pulse width modulator (PWM) 131 and a DAC 133. The VCO tuning circuit is adjusted based on a comparison of the output of VCO 101 and the multiplied output of calibration VCO 152.

However, using a calibration VCO to generate a reference frequency adds cost to the system and occupies valuable space. Thus, a need exists for a device with improved isolation of a tuning voltage for a VCO and an improved method of frequency calibrating a VCO. This invention addresses these needs and others.

SUMMARY OF THE INVENTION

In an exemplary embodiment, a free running VCO has two modes: a normal operating mode and a calibration mode. In the calibration mode, the frequency of the free running VCO is set to a desired calibration frequency using a phase lock loop and the corresponding tuning voltage is measured. This is in contrast to the prior art in which frequency calibration is performed by comparing the frequency of the free running VCO to the frequency of a calibration VCO. Furthermore, in an exemplary embodiment, a DAC voltage is compared to the tuning voltage of the phase locked VCO. This comparison determines the correct DAC setting to use at the calibration frequency when the VCO returns to its normal free-running mode. Furthermore, an offset voltage error of the circuit is measured by comparing the tuning voltage and DAC voltage during normal operating mode. The offset error voltage may be compensated for during frequency calibration. In addition, in various embodiments a reference crystal oscillator used in the phase lock loop is located on a DSP module instead of on the RF module. In yet another exemplary embodiment, the free running VCO is the only high frequency VCO on a radio frequency module.

DETAILED DESCRIPTION

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

In contrast to the described prior art, in an exemplary embodiment of the present invention, a free running VCO has two modes: a normal operating mode and a calibration mode. In the calibration mode, the frequency of the free running VCO is set to a desired calibration frequency using a phase lock loop and a tuning voltage is measured. This is in contrast to the prior art in which frequency calibration is performed by comparing the frequency of the free running VCO to a calibration VCO. Furthermore, in an exemplary embodiment, the DAC voltage is compared to tuning voltage of the phase locked VCO. The DAC voltage is adjusted to determine a correct DAC setting to use that corresponds to the calibration frequency when the free running VCO returns to the normal operating mode. Furthermore, the offset voltage error of a difference amplifier can be measured and compensated for as part of the frequency calibration. In addition, in various embodiments a reference crystal oscillator used in the phase lock loop is located on a DSP module instead of on the RF module. In yet another exemplary embodiment, the free running VCO is the only high frequency VCO on a radio frequency module.

Figure 1:
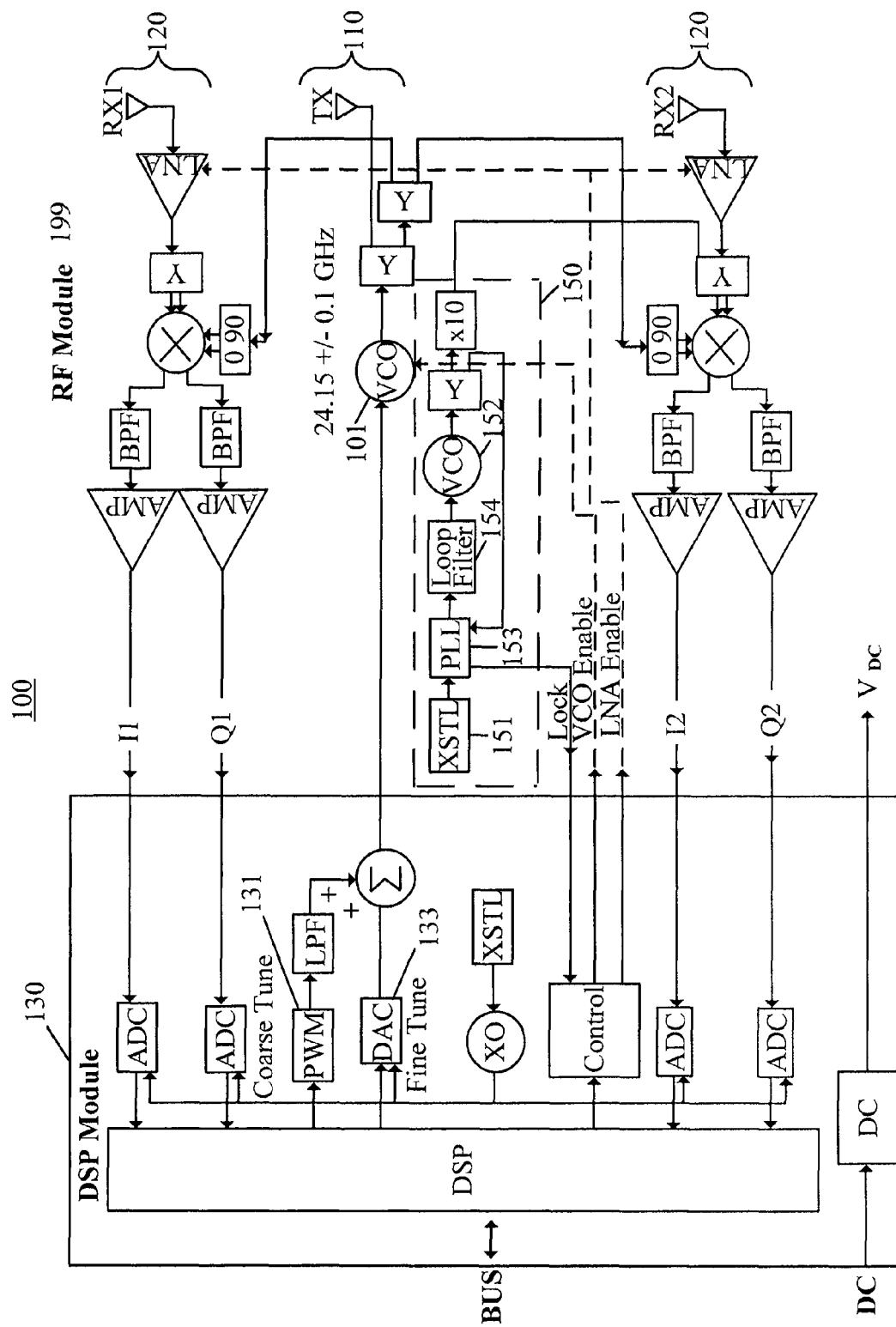
FIG. 1 shows an example of a prior art VCO tuning schematic.
Figure 2:
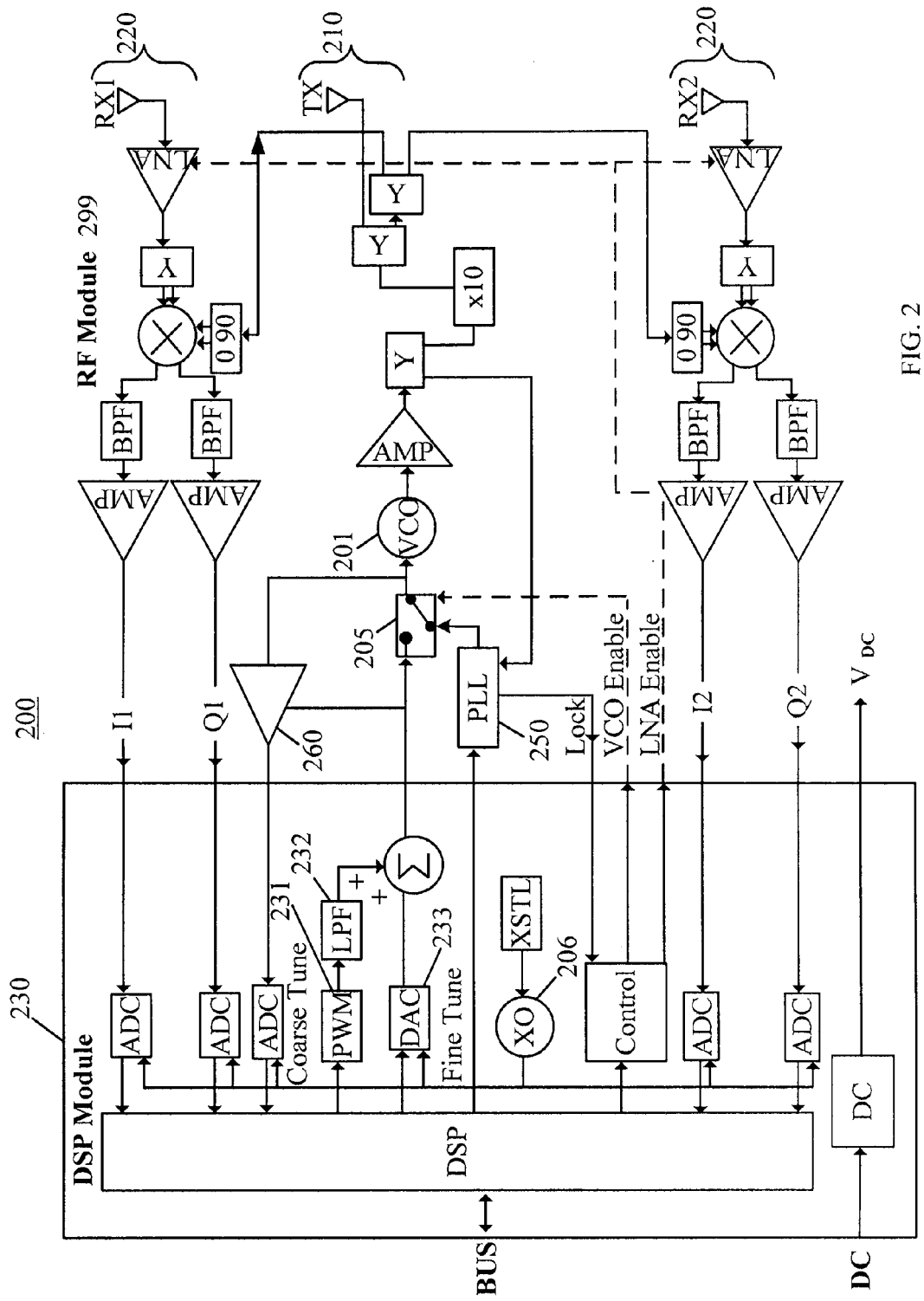
FIG. 2 shows an exemplary embodiment of a frequency calibration circuit comprising discrete components.

In accordance with an exemplary embodiment and with reference to FIG. 2, a frequency calibration architecture 200 comprises an RF module 299 and a DSP module 230. In accordance with an exemplary embodiment, RF module 299 is a printed circuit board (PCB). In another exemplary embodiment, RF module 299 comprises a monolithic microwave integrated circuit (MMIC). For example, the MMIC may be an integrated radar transceiver circuit. The RF module further comprises a free running VCO 201, a switch 205, a phase lock loop (PLL) 250, a difference amplifier 260, a transmit channel 210, and a receive channel(s) 220. The DSP module 230 may comprise a reference oscillator 206, and VCO tuning circuit of a PWM 231 and a DAC 233. In another exemplary embodiment, the VCO tuning circuit may also comprise a low pass filter (LPF) 232

In an exemplary embodiment, reference oscillator 206 is a crystal oscillator. Furthermore, reference oscillator 206 may be located off-chip or on-chip. The crystal oscillator 206 is able to produce a precise frequency. In another exemplary embodiment, the crystal oscillator also provides the clock function of a DSP Module. In various embodiments, multiple crystal oscillators are present in the radar system.

In an exemplary embodiment, free running VCO 201 is a high frequency oscillator. The frequency of the oscillation is controlled by a tuning input voltage from a VCO tuning circuit. In an exemplary embodiment, VCO 201 operates within the frequency range of about 22 GHz to about 29 GHz. In another exemplary embodiment, VCO 201 operates within the frequency range of about 10 GHz to 45 GHz. For example, VCO 201 may be a Hittite HMC533LP4. Furthermore, in an exemplary embodiment, VCO 201 is the only high frequency VCO on RF module 299. Moreover, frequency calibration architecture 200 may comprise any suitable VCO now known or hereinafter devised.

Figure 3:
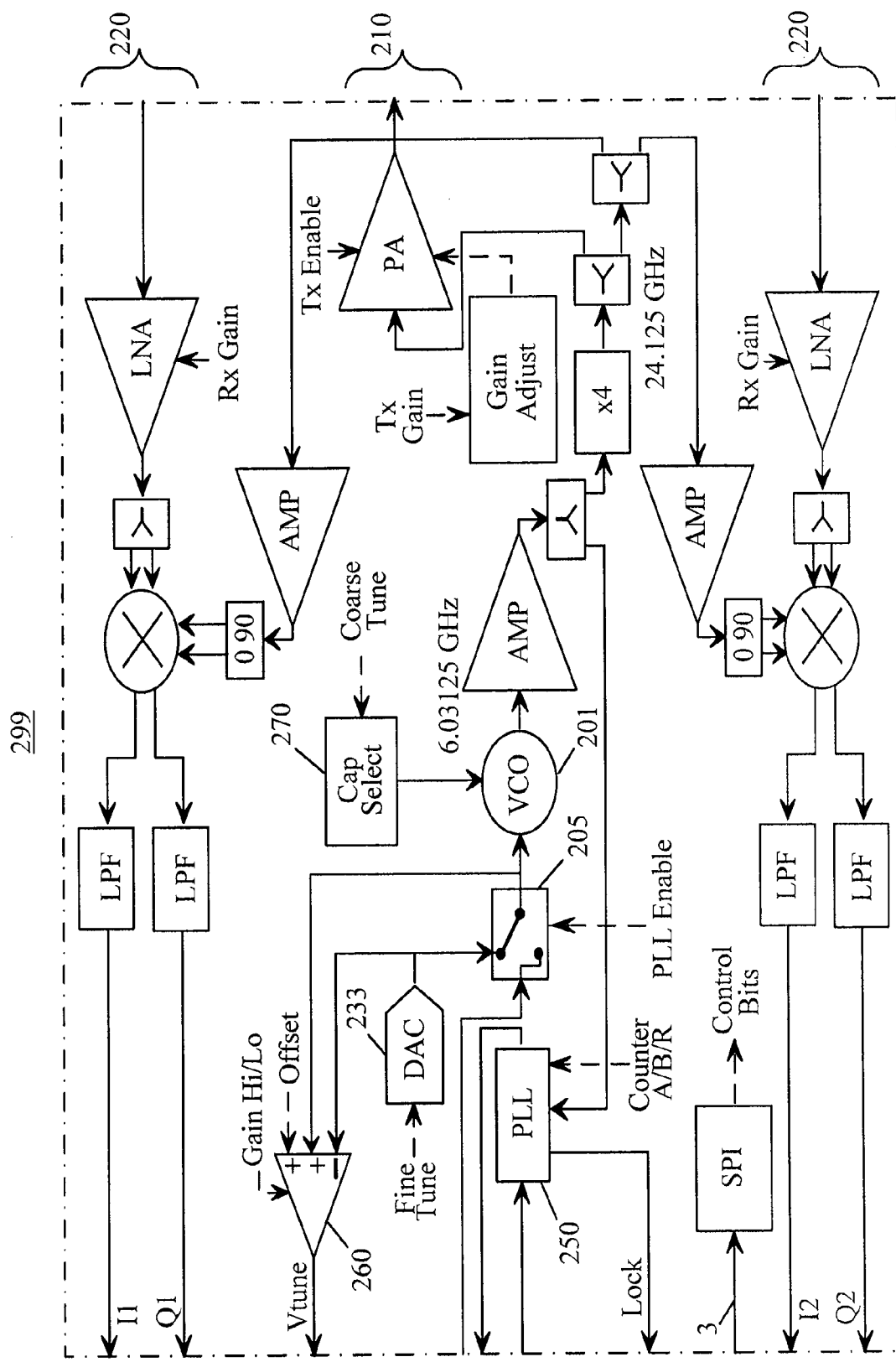
FIG. 3 shows an exemplary embodiment of an integrated frequency calibration architecture.

In accordance with an exemplary embodiment and with reference to FIG. 3, the VCO tuning circuit is located on RF module 299, allowing for a digital connection between RF module 299 and the DSP module. The benefit of such a connection is that a digital board-to-board transmission is less susceptible to noise.

The VCO tuning circuit is configured to provide both coarse tuning and fine tuning of VCO 201. The VCO needs to be tuned because the oscillation characteristics may drift, and/or vary with semiconductor process and temperature. Coarse tuning is facilitated by PWM 231 receiving a digital input signal from the DSP. The output of PWM 231 connects to VCO 201 after being added to the output of DAC 233. In another exemplary embodiment, the output of PWM 231 passes through LPF 232 before reaching VCO 201. In an exemplary embodiment, and with reference to FIG. 4, PWM 231 is replaced by a group of parallel capacitors 270 with switches to adjust resonant frequency and configured to perform coarse tuning on-chip. Furthermore, any suitable device(s) that perform coarse tuning on-chip may be used.

In an exemplary embodiment, fine tuning of VCO 201 is achieved by DAC 233, which also connects to the DSP to receive a digital input signal. In an exemplary embodiment, the output of DAC 233 is in communication with a varactor diode in VCO 201. In another exemplary embodiment, DAC 233 is designed on the same monolithic die as VCO 201.

Figure 4:
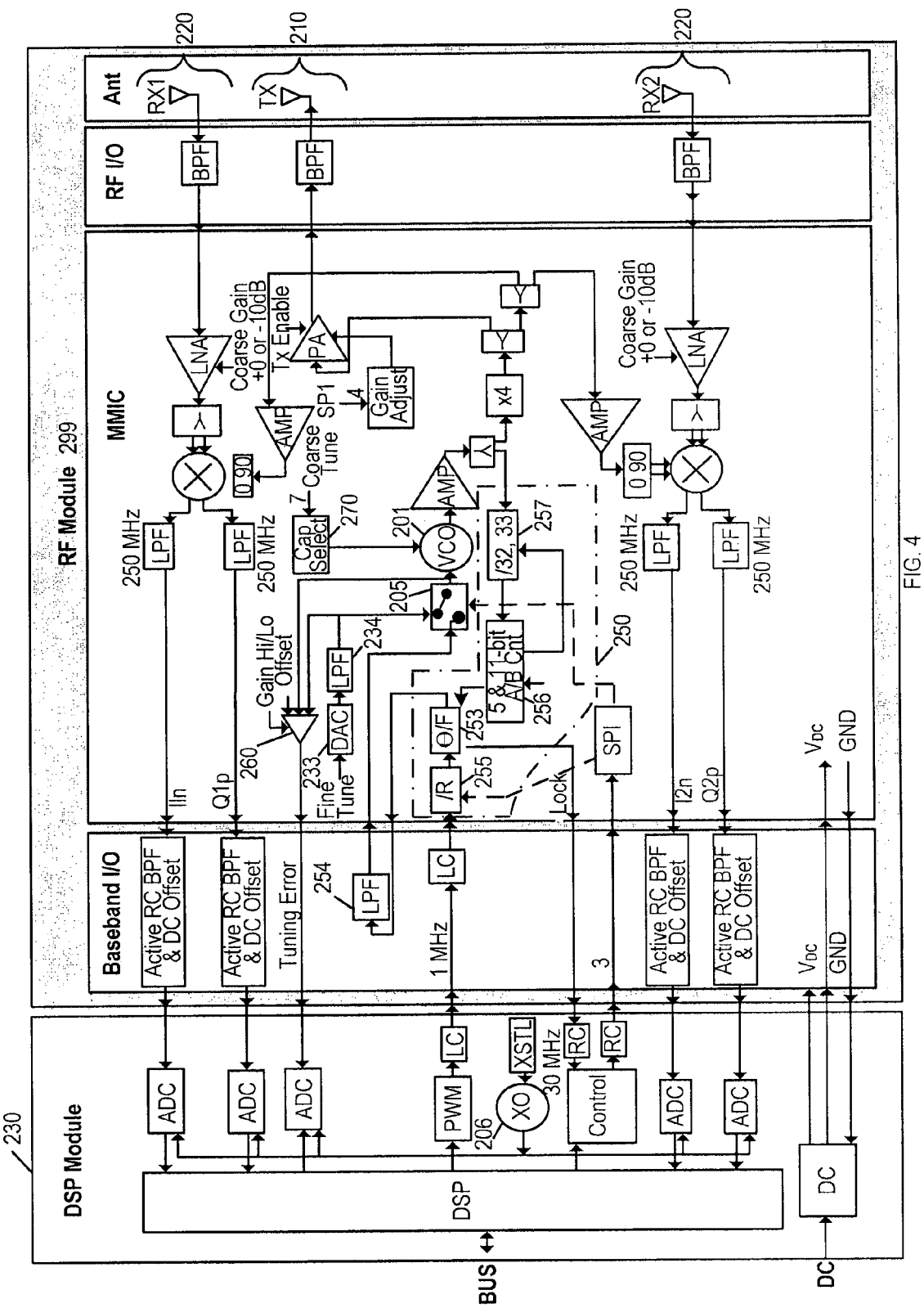
FIG. 4 shows another example schematic of an integrated frequency calibration architecture.

In accordance with an exemplary embodiment, and with reference to FIG. 4, PLL 250 comprises a phase/frequency detector 253, a reference divider 255, a control counter 256, and a dual-modulus prescaler 257. In an exemplary embodiment, dual-modulus prescaler 257 divides by factors of 32 and 33, and control counter 256 is a 5 & 11-bit counter. Furthermore, any suitable value(s) of dual-modulus prescaler 257 and control counter 256 may be used. In another exemplary embodiment, PLL 250 further comprises a charge pump (not shown) which is associated with phase/frequency detector 253.

In the exemplary embodiment, switch 205 is configured to switch VCO 201 between the normal operating mode and the calibration mode. Furthermore, in one embodiment, the switch is controlled by a PLL ENABLE control line of the DSP. In an exemplary embodiment, and with reference to FIGS. 3 and 4, control signals are communicated from DSP 230 through a serial peripheral interface (SPI) to RF module 299. In an exemplary embodiment, the control signals include the PLL ENABLE signal, a control signal for control counter 256, and a control signal for reference divider 255.

Normal Mode

During the normal mode of operation, the VCO is connected to DAC 233, which may be on DSP module 230 or RF module 299. In the normal operation mode, the VCO tuning circuit generates a tuning voltage, which controls VCO 201. The tuning voltage is set by DSP 230, and corresponds to a desired VCO output frequency. In an exemplary embodiment, a database or table is used to store output frequencies and corresponding tuning voltages.

Calibration Mode

In accordance with an exemplary embodiment, in the calibration mode, VCO 201 is connected to PLL 250 and disconnected from DAC 233, so that VCO 201 may be calibrated. In an exemplary method of the calibration mode, frequency calibrating a free running VCO includes implementing a phase lock loop on the VCO at a programmed frequency.

When VCO 201 is in calibration mode, the output of VCO 201 is split and transmitted into dual-modulus prescaler 257. Dual-modulus prescaler 257 divides the VCO output frequency and transmits the reduced frequency output to phase/frequency detector 253. Additionally, phase/frequency detector 253 receives a reference signal from reference oscillator 206. In an exemplary embodiment, the reference signal passes through reference divider 255 prior to reaching phase/frequency detector 253. The reference divider 255 divides the reference frequency and allows for the reference frequency to be transmitted at a higher frequency from DSP module 230 to RF module 299. In an exemplary embodiment, transmitting across the board-to-board connection at a higher frequency results in less interference with other signals on DSP module 230. The phase/frequency detector 255 compares the reference signal to the reduced VCO output signal, and generates a voltage signal representing the phase difference of the two signal inputs. The PLL 250 automatically adjusts the input voltage of the VCO using the phase difference voltage signal.

Furthermore, in the exemplary method and with continued reference to FIG. 4, one of the steps to frequency calibrate is to compare a DAC voltage to the VCO tuning voltage after being phase locked at the programmed frequency. In other words, while VCO 201 is connected to PLL 250, the input voltage to VCO 201 is compared to the output voltage of DAC 233. Furthermore, in another exemplary embodiment, the DAC communicates a signal through a low-pass filter 234 to a difference amplifier 260. The difference amplifier 260 compares the VCO input voltage and the voltage of the DAC, resulting in a Tuning Error that is transmitted to a DSP. The DAC voltage for a particular programmed frequency is determined when the DAC voltage is equal, or approximately equal to the VCO voltage. Adjusting the DAC voltage to equal or closely equal the VCO voltage provides the data point for a DAC voltage corresponding to the particular frequency during normal operation. In an exemplary embodiment, the data point and programmed frequency are stored along with the corresponding DAC voltage to create a reference database.

In an exemplary embodiment, the error in measuring the Tuning Error voltage is taken into account during the calibration process. In accordance with the exemplary embodiment, when VCO 201 is in calibration mode, the DAC output voltage is adjusted to cause a Tuning Error output voltage of the DAC to be equal or approximately equal to the offset voltage measured in the normal mode. This adjustment of the DAC voltage allows the DAC to compensate for any offset voltage. In one embodiment, the DAC compensates using difference amplifier 260 located on the integrated circuit of RF module 299 and an ADC located on DSP 230. Since in normal operation, the VCO tuning voltage is the same as the output voltage of the DAC, the offset voltage is measured by comparing the two. In another exemplary embodiment, a frequency calibration table is populated using data points where the DAC voltage has been adjusted to compensate for the offset voltage of the VCO.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. An integrated frequency calibration architecture comprising:
    a radio frequency (RF) module in communication with a digital signal processor (DSP) module, wherein the RF module is located on an integrated circuit;
    a voltage controlled oscillator (VCO) on the RF module, wherein the VCO is configured to have a normal operation mode and a frequency calibration mode;
    a phase lock loop (PLL) on the RF module, wherein the PLL provides a VCO input voltage to the VCO based on a scaled reference frequency during the frequency calibration mode;
    a VCO tuning circuit comprising a digital-to-analog converter (DAC), wherein the DAC adjusts to the VCO input voltage during the frequency calibration mode, and wherein the DAC connects to the VCO during the normal operation mode; and
    a switch configured to switch the VCO between the normal operation mode and the frequency calibration mode.

2. The integrated frequency calibration architecture of claim 1, wherein the switch is controlled by an enable signal from the DSP module.

3. The integrated frequency calibration architecture of claim 1, wherein the VCO tuning circuit is located on the DSP module.

4. The integrated frequency calibration architecture of claim 1, wherein the VCO tuning circuit is located on the RF module.

5. The integrated frequency calibration architecture of claim 1, wherein the integrated circuit is a monolithic microwave integrated circuit (MMIC).

6. The integrated frequency calibration architecture of claim 5, wherein the MMIC is configured for use in a radar system.

7. The integrated frequency calibration architecture of claim 1, further comprising a database configured to store an oscillating frequency of the VCO and a corresponding tuning voltage of the DAC.

8. The integrated frequency calibration architecture of claim 1, wherein the PLL comprises:
    a dual-modulus prescaler and a control counter configured to reduce a VCO output frequency to generate a reduced VCO output frequency; and
    a reference divider configured to receive a reference frequency from a reference oscillator and generate the scaled reference frequency; and
    a phase/frequency detector configured to compare the scaled reference frequency and the reduced VCO output frequency of the VCO;
    wherein the phase/frequency detector outputs a difference voltage configured to adjust the VCO output frequency during the frequency calibration mode.

9. The integrated frequency calibration architecture of claim 8, wherein the reference oscillator is a crystal oscillator.

10. The integrated frequency calibration architecture of claim 9, wherein the crystal oscillator is located on the RF module.

11. The integrated frequency calibration architecture of claim 9, wherein the crystal oscillator is not located on the RF module, and wherein the crystal oscillator is a digital signal processor clock.

12. The integrated frequency calibration architecture of claim 1, wherein the VCO is a high frequency VCO, and wherein the VCO is the only high frequency VCO on the RF module, and wherein high frequency is a frequency of 10 GHz or more.

13. A method of frequency calibration of a voltage controlled oscillator (VCO) on an integrated circuit, the method comprising:
    phase locking, on the integrated circuit, the VCO based on a reference frequency and a VCO output frequency and generating a VCO input voltage; and
    adjusting an output voltage of a digital-to-analog converter (DAC) to match the VCO input voltage during a frequency calibration mode and to generate an adjusted DAC output voltage;
    wherein the adjusted DAC output voltage provides the VCO input voltage during a normal operating mode.

14. The method of claim 13, further comprising:
    comparing, during the normal operating mode, the VCO input voltage with the adjusted DAC output voltage using a difference amplifier, wherein the difference amplifier generates an offset error voltage; and
    correcting the adjusted DAC output voltage by the offset error voltage, wherein the correcting is configured to compensate for an offset error of the DAC.

15. The method of claim 14, further comprising correcting a stored DAC output voltage by the offset error voltage.

16. The method of claim 13, further comprising repeating the method with another programming frequency.

17. The method of claim 13, wherein the reference frequency is generated by a crystal oscillator.

18. The method of claim 13, wherein the VCO is a high frequency VCO, and wherein the VCO is the only high frequency VCO on a radio frequency (RF) module, and wherein high frequency is a frequency of 10 GHz or more.

19. The method of claim 13, wherein the adjusted DAC output voltage and the corresponding VCO output frequency are stored in a reference table in response to the adjusted DAC output voltage substantially equaling the VCO input voltage based on the reference frequency.

20. A method of frequency calibration of a voltage controlled oscillator (VCO), the method comprising:
   phase locking the VCO based on a reference frequency and a VCO output frequency and generating a VCO input voltage; and
   adjusting an output voltage of a digital-to-analog converter (DAC) to match the VCO input voltage during a frequency calibration mode and to generate an adjusted DAC output voltage;
   wherein the adjusted DAC output voltage provides the VCO input voltage during a normal operating mode;
   comparing the adjusted DAC output voltage and the VCO input voltage during the normal operating mode to measure a comparator offset voltage error; and
   re-adjusting the output voltage of the DAC to match a combination of the VCO input voltage and the comparator offset voltage error to re-generate the adjusted DAC output voltage.

* * * * *